US009594147B2

(12) United States Patent
Han et al.

(10) Patent No.: US 9,594,147 B2
(45) Date of Patent: Mar. 14, 2017

(54) WIRELESS ELECTRONIC DEVICE WITH CALIBRATED REFLECTOMETER

(71) Applicant: Apple Inc., Cupertino, CA (US)

(72) Inventors: Liang Han, Sunnyvale, CA (US);
Matthew A. Mow, Los Altos, CA (US);
Thomas E. Biedka, San Jose, CA (US);
Mattia Pascolini, San Francisco, CA (US); Ming-Ju Tsai, Cupertino, CA (US); James G. Judkins, Campbell, CA (US); Victor Lee, Sunnyvale, CA (US); Robert W. Schlub, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 280 days.

(21) Appl. No.: 14/506,123

(22) Filed: Oct. 3, 2014

(65) Prior Publication Data
US 2016/0097833 A1 Apr. 7, 2016

(51) Int. Cl.
*G01R 29/08* (2006.01)
*G01C 3/08* (2006.01)
(Continued)

(52) U.S. Cl.
CPC ....... *G01R 35/005* (2013.01); *G01R 29/0878* (2013.01); *H01Q 1/243* (2013.01); *H04B 17/103* (2015.01); *H04B 17/14* (2015.01)

(58) Field of Classification Search
CPC ... G01V 3/32; G01V 3/38; G01V 3/15; G01V 3/165; G01V 3/081; G01V 3/10;
(Continued)

(56) References Cited

U.S. PATENT DOCUMENTS 5,172,064 A * 12/1992 Walls .................. G01R 35/005
324/601
5,712,064 A * 1/1998 Miyazaki .......... G02F 1/133516
347/100
(Continued)

FOREIGN PATENT DOCUMENTS

CN 102325339 8/2014
WO 2011023933 3/2011

*Primary Examiner* — Patrick Assouad
*Assistant Examiner* — Taqi Nasir
(74) *Attorney, Agent, or Firm* — Treyz Law Group, P.C.; G. Victor Treyz; Joseph F. Guihan

(57) ABSTRACT

An electronic device may have control circuitry that uses a reflectometer to measure antenna impedance during operation. The reflectometer may have a directional coupler that is coupled between radio-frequency transceiver circuitry and an antenna. A calibration circuit may be coupled between the directional coupler and the antenna. The calibration circuit may have a first port coupled to the antenna, a second port coupled to the directional coupler, and a third port that is coupled to a calibration resistance. The reflectometer may have terminations of identical impedance that are coupled to ground. Switching circuitry in the reflectometer may be used to route signals from the directional coupler to a feedback receiver for measurement by the control circuitry or to ground through the terminations. Calibrated antenna reflection coefficient measurements may be used in dynamically adjusting the antenna.

22 Claims, 8 Drawing Sheets

(51) Int. Cl.
*G01R 35/00* (2006.01)
*H01Q 1/24* (2006.01)
*H04B 17/10* (2015.01)
*H04B 17/14* (2015.01)

(58) Field of Classification Search
CPC . G01V 3/08; G01V 3/104; G01V 3/14; G01V 3/28
USPC ....... 324/601, 603, 613, 614, 301, 303, 326, 324/329–332, 66–67, 334, 22, 260–261, 324/637–648
See application file for complete search history.

(56) References Cited

U.S. PATENT DOCUMENTS

| | | | |
|---|---|---|---|
| 6,845,126 B2 | 1/2005 | Dent et al. | |
| 7,443,154 B1* | 10/2008 | Merewether | G01V 3/104 324/326 |
| 7,486,386 B1* | 2/2009 | Holcombe | G01C 3/08 356/4.01 |
| 7,764,935 B2 | 7/2010 | Pallonen et al. | |
| 8,135,354 B2 | 3/2012 | Duron et al. | |
| 8,417,296 B2 | 4/2013 | Caballero et al. | |
| 8,498,322 B2 | 7/2013 | Smiley | |
| 8,532,697 B2 | 9/2013 | Pascolini | |
| 8,629,719 B2 | 1/2014 | Destouches et al. | |
| 8,744,384 B2 | 6/2014 | Mendolia et al. | |
| 8,767,871 B2 | 7/2014 | Parlk et al. | |
| 8,768,273 B2 | 7/2014 | Rozenblit et al. | |
| 8,781,420 B2 | 7/2014 | Schlub et al. | |
| 2003/0210203 A1 | 11/2003 | Phillips et al. | |
| 2007/0103367 A1* | 5/2007 | Wang | H01Q 9/42 343/700 MS |
| 2008/0165065 A1* | 7/2008 | Hill | H01Q 1/243 343/702 |
| 2009/0096683 A1 | 4/2009 | Rosenblatt et al. | |
| 2009/0256759 A1* | 10/2009 | Hill | H01Q 1/243 343/702 |
| 2011/0215814 A1* | 9/2011 | Dorrough | G01R 27/26 324/663 |
| 2012/0112851 A1 | 5/2012 | Manssen et al. | |
| 2012/0139776 A1* | 6/2012 | Malmqvist | H01Q 3/267 342/174 |
| 2012/0196591 A1 | 8/2012 | O'Keeffe et al. | |
| 2012/0206304 A1* | 8/2012 | Clow | H04B 17/103 343/703 |
| 2012/0295554 A1 | 11/2012 | Greene et al. | |
| 2012/0309322 A1 | 12/2012 | Xu et al. | |
| 2013/0154897 A1 | 6/2013 | Sorensen et al. | |
| 2013/0257667 A1 | 10/2013 | Kang | |
| 2013/0315076 A1 | 11/2013 | Zhao et al. | |
| 2013/0331042 A1 | 12/2013 | See et al. | |

* cited by examiner $$a_{4f} = \frac{S_{42f} b_{3f} + (S_{41f} S_{32f} - S_{31f} S_{42f}) a_{1f}}{S_{42f} S_{34f} - S_{32f} S_{44f} + \dfrac{S_{32f}}{\Gamma}}$$

FIG. 6

$$a_{2f} = \frac{b_{3f} - S_{31f} a_{1f} - S_{34f} a_{4f}}{S_{32f}}$$

FIG. 7

$$\Gamma_{AUT} = \frac{a_{2f}}{b_{2f}} = \frac{a_{2f}}{S_{21f} a_{1f} + S_{22f} a_{2f} + S_{24f} a_{4f}}$$

FIG. 8

WIRELESS ELECTRONIC DEVICE WITH CALIBRATED REFLECTOMETER

BACKGROUND

This relates generally to electronic devices and, more particularly, to wireless electronic devices.

Electronic devices often include wireless circuitry. For example, cellular telephones, computers, tablet computers, and other devices often contain antennas for supporting wireless communications.

It can be challenging to form wireless circuitry in electronic devices that is completely immune to environmental effects. As a result, antennas and other wireless circuits may experience variations in performance under different operating conditions. If, for example, an electronic device is resting against a metal table top, an antenna in that device may be loaded differently than when the electronic device is operated in free space.

It would therefore be desirable to be able to provide electronic devices with wireless circuitry that that can better accommodate changes in operating environment.

SUMMARY

An electronic device may have control circuitry that uses a reflectometer to measure antenna reflection coefficients and therefore monitor antenna impedance during operation. The reflectometer may have a directional coupler that is coupled between radio-frequency transceiver circuitry and an antenna. The directional coupler may also include a pair of terminations that are coupled to ground. The terminations may have identical impedance values. A feedback receiver with vector signal analyzer capabilities may be used in the reflectometer to gather signals from the directional coupler. Switching circuitry in the reflectometer may be used to route signals from the directional coupler to a feedback receiver for measurement by the control circuitry or to ground through the termination resistors.

A calibration circuit may be coupled between the directional coupler and the antenna. The calibration circuit may have a first port coupled to the antenna, a second port coupled to the directional coupler, and a third port that is coupled to a calibration resistance. The value of the calibration resistance is known, which allows the reflectometer to be calibrated.

During calibration operations, the reflection coefficients for the termination resistors can be obtained while the calibration resistor is switched into use. These reflection coefficients may then be stored in the control circuitry to calibrate the reflectometer.

During normal operation, calibrated reflection coefficient measurements may be made for the antenna by using the stored reflection coefficient values. The calibrated reflection coefficient measurements may be used by the control circuitry in determining how to adjust circuitry in the antenna. For example, control circuitry may make real time antenna adjustments to compensate for antenna detuning due to changes in antenna loading from contact of a body part or other external object with the antenna or other changes in the operating environment for the antenna.

BRIEF DESCRIPTION OF THE DRAWINGS

FIGS. 6, 7, and 8 show equations that may be used in analyzing forward path measurements made on an antenna using the reflectometer of FIG. 5 in accordance with an embodiment.

DETAILED DESCRIPTION

Figure 1:
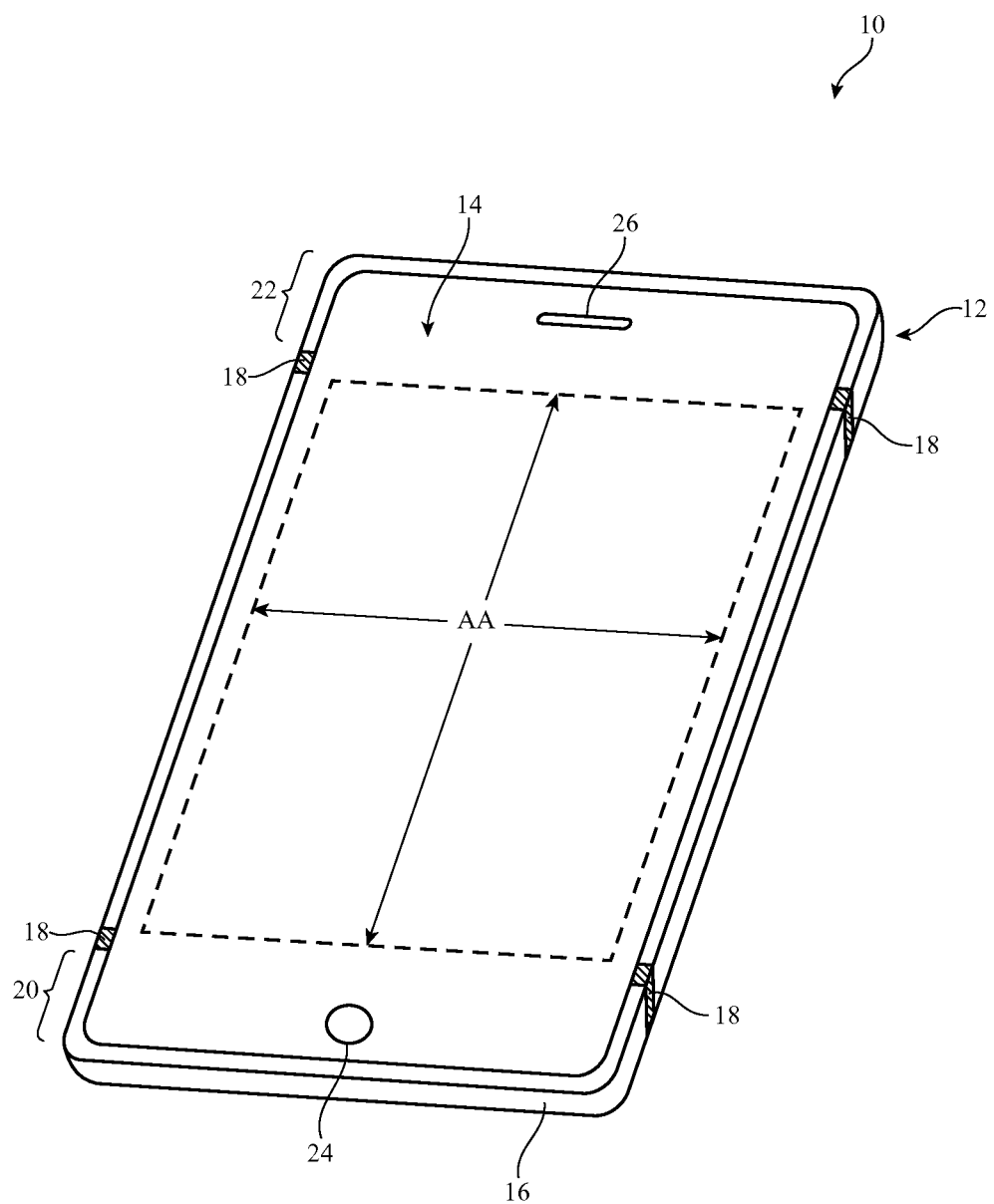
FIG. 1 is a perspective view of an illustrative electronic device in accordance with an embodiment.

Electronic devices such as electronic device 10 of FIG. 1 may be provided with circuitry such as wireless communications circuitry. The wireless circuitry may include one or more antennas for transmitting and receiving wireless signals. An antenna or other wireless circuitry may be monitored in real time using a reflectometer. A calibration procedure may be used to ensure that measurements from the reflectometer will be accurate.

Device 10 may include one or more antennas such as loop antennas, inverted-F antennas, strip antennas, planar inverted-F antennas, slot antennas, hybrid antennas that include antenna structures of more than one type, or other suitable antennas. Conductive structures for the antennas may, if desired, be formed from conductive electronic device structures. The conductive electronic device structures may include conductive housing structures and internal structures (e.g., brackets, metal members that are formed using techniques such as stamping, machining, laser cutting, etc.), and other conductive electronic device structures. The housing structures may include peripheral structures such as peripheral conductive structures that run around the periphery of an electronic device. The peripheral conductive structure may serve as a bezel for a planar structure such as a display, may serve as sidewall structures for a device housing, may have portions that extend upwards from an integral planar rear housing (e.g., to form vertical planar sidewalls or curved sidewalls), and/or may form other housing structures. Gaps may be formed in the peripheral conductive structures that divide the peripheral conductive structures into peripheral segments. One or more of the segments may be used in forming one or more antennas for electronic device 10. Antennas may also be formed using an antenna ground plane formed from conductive housing structures such as metal housing midplate structures and other internal device structures. Rear housing wall structures may be used in forming antenna structures such as an antenna ground.

Electronic device 10 may be a portable electronic device or other suitable electronic device. For example, electronic device 10 may be a laptop computer, a tablet computer, a somewhat smaller device such as a wristwatch device, pendant device, headphone device, earpiece device, or other wearable or miniature device, a handheld device such as a cellular telephone, a media player, an electronic stylus, or other small portable device. Device 10 may also be a television, a set-top box, a desktop computer, a computer monitor into which a computer has been integrated, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

The rear face of housing 12 may have a planar housing wall. The rear housing wall may be formed from metal with one or more regions that are filled with plastic or other dielectric. Portions of the rear housing wall that are separated by dielectric in this way may be coupled together using conductive structures (e.g., internal conductive structures) and/or may be electrically isolated from each other.

Device 10 may, if desired, have a display such as display 14. Display 14 may be mounted on the opposing front face of device 10 from the rear housing wall. Display 14 may be a touch screen that incorporates capacitive touch electrodes or may be insensitive to touch.

Display 14 may include image pixels formed from light-emitting diodes (LEDs), organic LEDs (OLEDs), plasma cells, electrowetting pixels, electrophoretic pixels, liquid crystal display (LCD) components, or other suitable image pixel structures. A display cover layer such as a layer of clear glass or plastic, a layer of sapphire, a transparent dielectric such as clear ceramic, fused silica, transparent crystalline material, or other materials or combinations of these materials may cover the surface of display 14. Buttons such as button 24 may pass through openings in the cover layer. The cover layer may also have other openings such as an opening for speaker port 26.

Housing 12 may include peripheral housing structures such as structures 16. Structures 16 may run around the periphery of device 10 and display 14. In configurations in which device 10 and display 14 have a rectangular shape with four edges, structures 16 may be implemented using peripheral housing structures that have a rectangular ring shape with four corresponding edges (as an example). Peripheral structures 16 or part of peripheral structures 16 may serve as a bezel for display 14 (e.g., a cosmetic trim that surrounds all four sides of display 14 and/or that helps hold display 14 to device 10). Peripheral structures 16 may also, if desired, form sidewall structures for device 10 (e.g., by forming a metal band with vertical sidewalls, by curved sidewalls that extend upwards as integral portions of a rear housing wall, etc.).

Peripheral housing structures 16 may be formed of a conductive material such as metal and may therefore sometimes be referred to as peripheral conductive housing structures, conductive housing structures, peripheral metal structures, or a peripheral conductive housing member (as examples). Peripheral housing structures 16 may be formed from a metal such as stainless steel, aluminum, or other suitable materials. One, two, or more than two separate structures may be used in forming peripheral housing structures 16.

It is not necessary for peripheral housing structures 16 to have a uniform cross-section. For example, the top portion of peripheral housing structures 16 may, if desired, have an inwardly protruding lip that helps hold display 14 in place. The bottom portion of peripheral housing structures 16 may also have an enlarged lip (e.g., in the plane of the rear surface of device 10). Peripheral housing structures 16 may have substantially straight vertical sidewalls, may have sidewalls that are curved, or may have other suitable shapes. In some configurations (e.g., when peripheral housing structures 16 serve as a bezel for display 14), peripheral housing structures 16 may run around the lip of housing 12 (i.e., peripheral housing structures 16 may cover only the edge of housing 12 that surrounds display 14 and not the rest of the sidewalls of housing 12).

If desired, housing 12 may have a conductive rear surface. For example, housing 12 may be formed from a metal such as stainless steel or aluminum. The rear surface of housing 12 may lie in a plane that is parallel to display 14. In configurations for device 10 in which the rear surface of housing 12 is formed from metal, it may be desirable to form parts of peripheral conductive housing structures 16 as integral portions of the housing structures forming the rear surface of housing 12. For example, a rear housing wall of device 10 may be formed from a planar metal structure and portions of peripheral housing structures 16 on the sides of housing 12 may be formed as vertically extending integral metal portions of the planar metal structure. Housing structures such as these may, if desired, be machined from a block of metal and/or may include multiple metal pieces that are assembled together to form housing 12. The planar rear wall of housing 12 may have one or more, two or more, or three or more portions.

Display 14 may include conductive structures such as an array of capacitive electrodes, conductive lines for addressing pixel elements, driver circuits, etc. Housing 12 may include internal structures such as metal frame members, a planar housing member (sometimes referred to as a midplate) that spans the walls of housing 12 (i.e., a substantially rectangular sheet formed from one or more parts that is welded or otherwise connected between opposing sides of member 16), printed circuit boards, and other internal conductive structures. These conductive structures, which may be used in forming a ground plane in device 10, may be located in the center of housing 12 under active area AA of display 14 (e.g., the portion of display 14 that contains a display module for displaying images).

In regions such as regions 22 and 20, openings may be formed within the conductive structures of device 10 (e.g., between peripheral conductive housing structures 16 and opposing conductive ground structures such as conductive housing midplate or rear housing wall structures, a printed circuit board, and conductive electrical components in display 14 and device 10). These openings, which may sometimes be referred to as gaps, may be filled with air and/or solid dielectrics such as plastic, glass, ceramic, polymers with fiber filler material (e.g., fiber composites), sapphire, etc.

Conductive housing structures and other conductive structures in device 10 such as a midplate, traces on a printed circuit board, display 14, and conductive electronic components may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 20 and 22. If desired, the ground plane that is under active area AA of display 14 and/or other metal structures in device 10 may have portions that extend into parts of the ends of device 10 (e.g., the ground may extend towards the dielectric-filled openings in regions 20 and 22).

In general, device 10 may include any suitable number of antennas (e.g., one or more, two or more, three or more, four or more, etc.). The antennas in device 10 may be located at opposing first and second ends of an elongated device housing (e.g., at ends 20 and 22 of device 10 of FIG. 1), along one or more edges of a device housing, in the center of a device housing, in other suitable locations, or in one or more of these locations. The arrangement of FIG. 1 is merely illustrative.

Portions of peripheral housing structures 16 may be provided with gap structures. For example, peripheral housing structures 16 may be provided with one or more peripheral gaps such as gaps 18, as shown in FIG. 1. The gaps in peripheral housing structures 16 may be filled with dielectric such as polymer, ceramic, glass, air, other dielectric materials, or combinations of these materials. Gaps 18 may divide peripheral housing structures 16 into one or more peripheral conductive segments. There may be, for example, two peripheral conductive segments in peripheral housing structures 16 (e.g., in an arrangement with two gaps), three peripheral conductive segments (e.g., in an arrangement with three gaps), four peripheral conductive segments (e.g., in an arrangement with four gaps, etc.). The segments of peripheral conductive housing structures 16 that are formed in this way may form parts of antennas in device 10. If desired, gaps may extend across the width of the rear wall of housing 12 and may penetrate through the rear wall of housing 12 to divide the rear wall into different portions. Polymer or other dielectric may fill these housing gaps (grooves).

In a typical scenario, device 10 may have upper and lower antennas (as an example). An upper antenna may, for example, be formed at the upper end of device 10 in region 22. A lower antenna may, for example, be formed at the lower end of device 10 in region 20. The antennas may be used separately to cover identical communications bands, overlapping communications bands, or separate communications bands. The antennas may be used to implement an antenna diversity scheme or a multiple-input-multiple-output (MIMO) antenna scheme.

Antennas in device 10 may be used to support any communications bands of interest. For example, device 10 may include antenna structures for supporting local area network communications, voice and data cellular telephone communications, global positioning system (GPS) communications or other satellite navigation system communications, Bluetooth® communications, etc.

Figure 2:
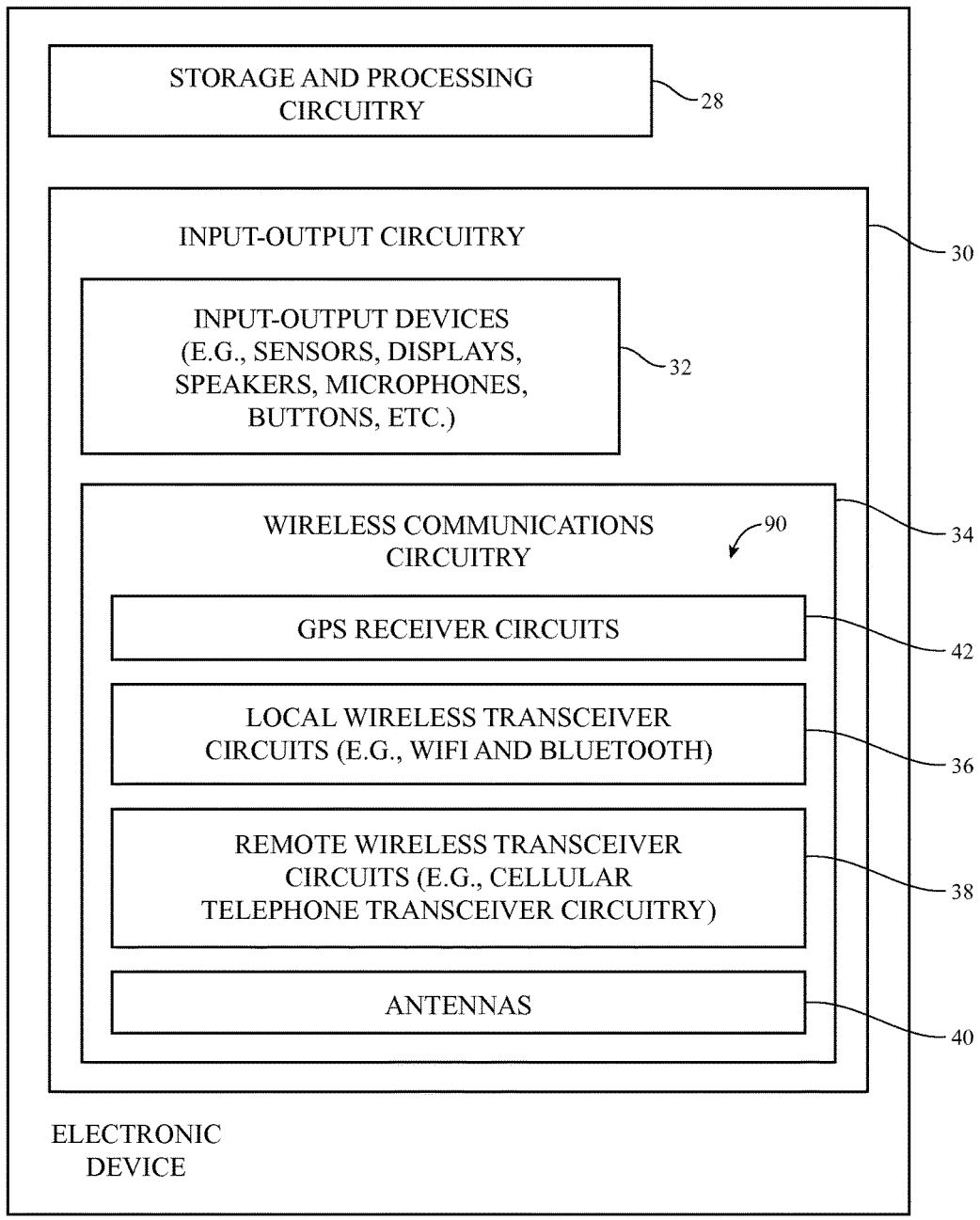
FIG. 2 is a schematic diagram of illustrative circuitry in an electronic device in accordance with an embodiment.

A schematic diagram showing illustrative components that may be used in device 10 of FIG. 1 is shown in FIG. 2. As shown in FIG. 2, device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, MIMO protocols, antenna diversity protocols, etc. Storage and processing circuitry 28 may, if desired, control the operation of adjustable antenna components to dynamically tune antennas in device 10.

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, fingerprint sensors (e.g., a fingerprint sensor integrated with a button such as button 24 of FIG. 1), etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in frequency ranges such as a low communications band from 700 to 960 MHz, a midband from 1710 to 2170 MHz, and a high band from 2300 to 2700 MHz or other communications bands between 700 MHz and 2700 MHz or other suitable frequencies (as examples). Circuitry 38 may handle voice data and non-voice data. Wireless communications circuitry 34 can include circuitry for other short-range and long-range wireless links if desired. For example, wireless communications circuitry 34 may include 60 GHz transceiver circuitry, circuitry for receiving television and radio signals, paging system transceivers, near field communications (NFC) circuitry, etc. Wireless communications circuitry 34 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include one or more antennas such as antennas 40. Antennas 40 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

Figure 3:
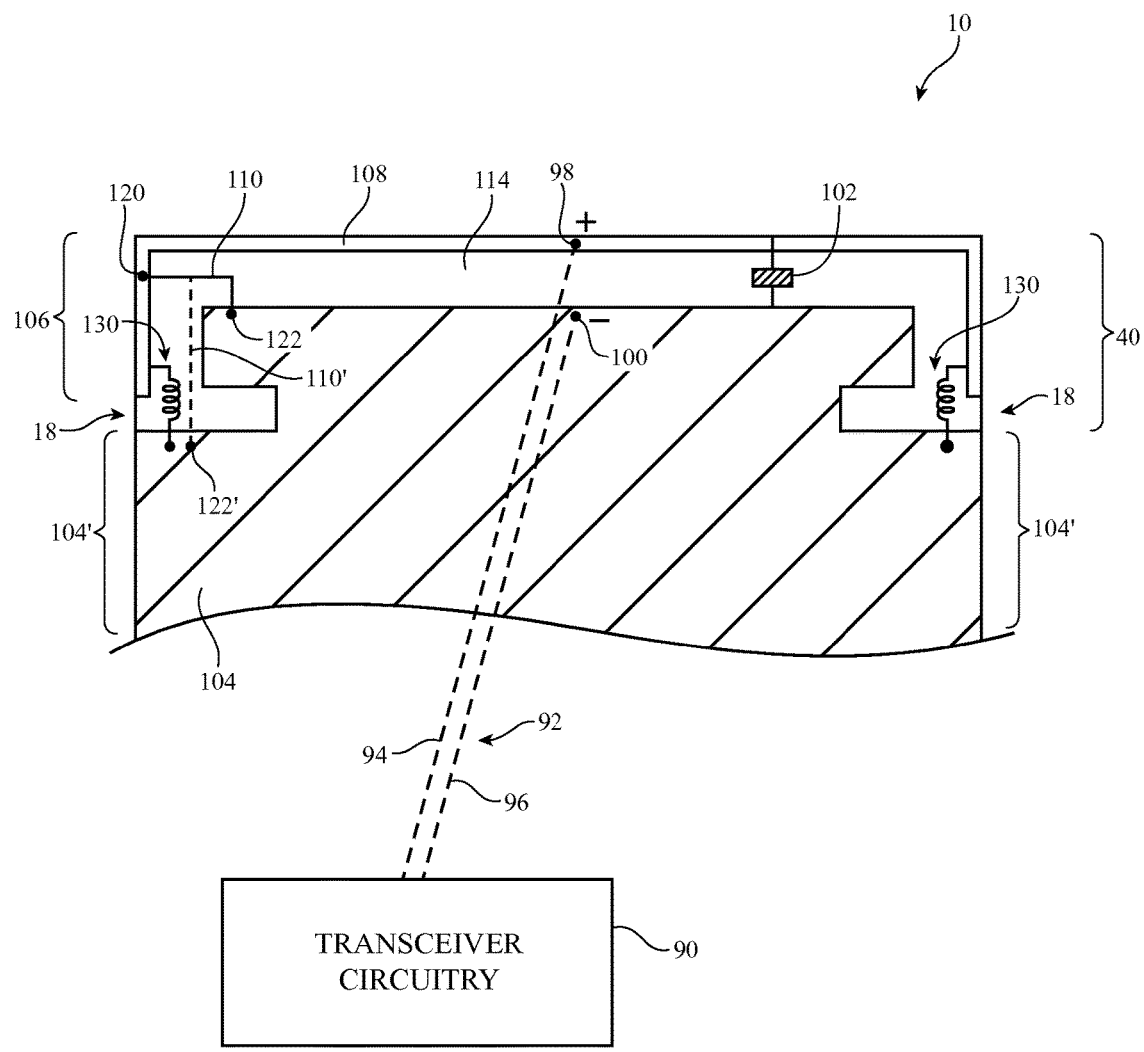
FIG. 3 is a top interior view of a portion of an electronic device having an antenna in accordance with an embodiment.

An interior top view of an illustrative antenna of the type that may be formed in device 10 is shown in FIG. 3. Antenna 40 of FIG. 3 may be formed at end 20, end 22, or other portion of device 10. The configuration for antenna 40 of FIG. 3 is based on an inverted-F antenna design with a slot resonating element (i.e., antenna 40 of FIG. 3 is a hybrid inverted-F slot antenna). This is merely illustrative. Antenna 40 may be any suitable type of antenna.

As shown in FIG. 3, antenna 40 may be coupled to transceiver circuitry 90, so that transceiver circuitry 90 may transmit antenna signals through antenna 40 and may receive antenna signals through antenna 40.

Transceiver circuitry 90 may be coupled to antenna 40 using paths such as transmission line path 92. Transmission line 92 may include positive signal line (path) 94 and ground signal line (path) 96. Transmission line 92 may be coupled to an antenna feed for antenna 40 that is formed from positive antenna feed terminal 98 and ground antenna feed terminal 100. Positive signal line 94 may be coupled to positive antenna feed terminal 98 and ground signal line 96 may be coupled to ground antenna feed terminal 100. If desired, impedance matching circuitry, switching circuitry, filter circuitry, reflectometer circuitry, and other circuits may be interposed in the path between transceiver circuitry 90 and antenna 40.

Antenna 40 of FIG. 3 includes inverted-F antenna resonating element 106 and antenna ground 104. Ground 104 may be formed from metal portions of housing 12 (e.g., portions of the rear wall of housing 12, a housing midplate, etc.), conductive structures such as display components and other electrical components, ground traces in printed circuits, etc. For example, ground 104 may include portions such as portions 104' that are formed from metal housing walls, a metal band or bezel, or other peripheral conductive housing structures.

Antenna resonating element 106 may be formed from conductive structure 108. Structure 108 may be formed from peripheral conductive housing structure in device 10 (e.g., a segment of structures 16 of FIG. 1) or other conductive structure. Structure 108 may form a main resonating element arm for inverted-F antenna resonating element 106 and may have left and right ends that are separate from ground structure 104' by peripheral gaps 18. Components such as inductors 130 may, if desired, span gaps 18 to help tune antenna 40.

Conductive structure 108 may have long and short branches (to the opposing sides of the antenna feed in the orientation of FIG. 3) that support respective lower and higher frequency antenna resonances (e.g., low band and mid-band resonances). Inverted-F antennas that have opposing branches such as these may sometimes be referred to as T antennas or multi-branch inverted-F antennas.

Dielectric 114 may form a gap that separates structure 108 from ground 104. The shape of the dielectric gap associated with dielectric 114 may form a slot antenna resonating element (i.e., the conductive structures surrounding dielectric 114 may form a slot antenna). The slot antenna resonating element may support an antenna resonance at higher frequencies (e.g., a high band resonance). Higher frequency antenna performance may also be supported by harmonics of the lower-frequency resonances associated with the longer and shorter branches of structure 108.

One or more electrical components such as components 102 may span dielectric gap 114. Components 102 may include resistors, capacitors, inductors, switches and other structures to provide tuning capabilities, etc. For example, components 102 may include an adjustable inductor that may be controlled by control circuitry 28 to produce a selected inductance value (e.g., a value selected form two possible inductances, a value selected from three or more possible inductances, etc.). The adjustable inductor may be adjusted using an electrically controlled switch or other circuitry. Adjustable circuitry such as the circuitry of components 102 may be used to tune the performance of antenna 40 dynamically during antenna operation. Fixed components may be included in components 102 to ensure that antenna 40 operates at desired frequencies.

Return path 110 may be coupled between the main inverted-F resonating element arm formed from structure 108 and antenna ground 104 in parallel with the antenna feed formed by feed terminals 98 and 100. Return path 110 may be formed from a metal member having opposing first and second ends. In the example of FIG. 3, return path 110 is formed from a metal structure that has a first end with a terminal 120 coupled to structure 108 of inverted-F antenna resonating element 106 (e.g., on a housing sidewall or other peripheral conductive structure) and has a second end with a terminal 122 coupled to antenna ground 104. Return path 110 may have other shapes and sizes, as illustrated, for example, by dashed line 110' and illustrative terminal 122'.

Antenna 40 may become detuned as device 10 and antenna 40 are exposed to different operating environments. For example, antenna 40 may be detuned when placed in a removable case, when rested on a table top such as a metal or insulating table top, when held in a user's hand or operated in the vicinity of other body parts, etc. By monitoring the condition of antenna 40, antenna 40 can be dynamically retuned by making adjustments to adjustable circuitry such as components 102 of FIG. 3.

Figure 4:
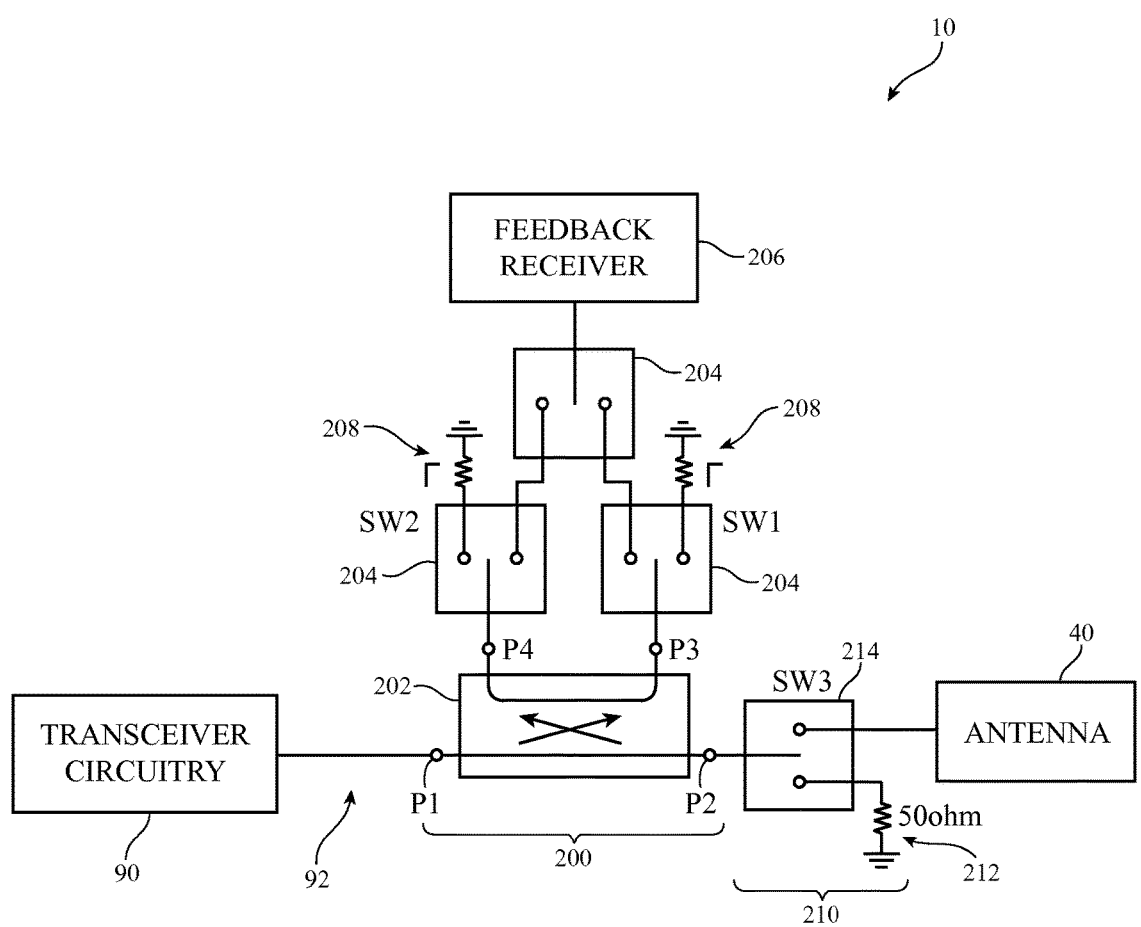
FIG. 4 is a diagram of a reflectometer of the type that may be used in monitoring the antenna of FIG. 3 or other wireless electronic device circuitry in accordance with an embodiment.

With one suitable arrangement, antenna 40 or other wireless circuitry in device 10 (e.g., part of a transmission line, part of an antenna, etc.) may be monitored using an on-board reflectometer. As shown in FIG. 4, for example, device 10 may include a reflectometer such as reflectometer 200. Reflectometer 200 may be interposed within transmission line path 92 between transceiver circuitry 90 and antenna 40. Reflectometer 200 may include directional coupler 202. Directional coupler 202 may have a first port (P1) coupled to transceiver circuitry 90, a second port (P2) coupled to antenna 40, and third and fourth ports (P3 and P4) that are coupled to terminations 208 (e.g., terminating circuits such as resistors and/or other electrical components) and feedback receiver 206 using switching circuitry 204. Terminations 208 may be coupled to ground. Feedback receiver 206 may be a vector receiver (sometimes referred to as a vector signal analyzer or vector analyzer). Feedback receiver 206 may make phase and magnitude measurements on signals from directional coupler 202. Feedback receiver 206 may be implemented at a stand-alone circuit or may be incorporated into transceiver circuitry 90 (as examples).

Switching circuitry 204 may be used to route signals from port P3 or P4 to feedback receiver 206. When switch SW1 is routing signals to receiver 206 from port P3, port P4 may be terminated to ground using one of terminations 208 (i.e., switch SW2 may couple port P4 to the termination 208 that is coupled to switch SW2). When switching circuitry 204 is configured so that switch SW2 couples port P4 to receiver 206, switch SW1 couples port P3 to one of terminations 208.

Terminations 208 and switching circuitry 204 may be implemented using an integrated circuit or other circuitry. Due to manufacturing variations, the precise resistance (impedance) of terminations 208 is not initially known, although it is accurate to assume that terminations 208 are well matched to each other and have identical impedance values. Because the impedances of terminations 208 are not initially known, the reflection coefficients Γ of terminations 208 are not initially known.

By using calibration circuit 210, the impedances and reflection coefficients Γ of terminations 208 may be measured by control circuitry 28 and these measured values retained in storage in control circuitry 28, thereby calibrating reflectometer 200 and device 10. During subsequent operation of device 10, reflectometer 200 may be used to make real time measurements on antenna 40 (e.g., measurements of antenna reflection coefficient Γaut and therefore antenna impedance).

During normal operation, calibration circuit 210 is placed in a first state and couples port P2 and antenna 40 together, so that transceiver circuitry 90 may transmit and receive antenna signals using antenna 40. When it is desired to calibrate reflectometer 200, switch S3 is configured to temporarily place calibration circuit 210 in a second state in which calibration circuit 210 switches calibration resistor 212 into use. Calibration resistor 212 may be a grounded 50 ohm resistor or other resistor with an accurately known resistance such as a resistor that is calibrated using test equipment before installation into device 10. When calibration circuit 210 is placed in its temporary second state, calibration resistor 212 will be coupled to directional coupler 202 in reflectometer 200 in place of antenna 40. The switch of switch SW3 in this type of scenario may be controlled by control signals from control circuitry 28. If desired, calibration circuit 210 may be implemented using a switch connector. During normal operation of the switch connector, port P2 and antenna 40 will be coupled to each other. When a probe is inserted into the switch connector during calibration operations, a calibrated 50 ohm resistance will be momentarily interposed within transmission line path 92 between port P2 of directional coupler 202 and antenna 40. In general, calibration circuit 210 may use an electrically controllable switch to switch calibration resistance 212 into use, may use a switch connector to momentarily switch calibration resistance 212 into use, or may use any other suitable switching circuitry to selectively couple port P2 of directional coupler 202 to either resistor 212 or antenna 40.

Reflectometer 200 may be configured to make forward path measurements and reverse path measurements. During calibration operations, which may be performed on a device-by-device basis or other suitable basis within a manufacturing facility during manufacturing, reflectometer 200 may be used in both the forward path and reverse path configurations while the known 50 ohm load of resistor 212 is switched into use to terminate port P2 to ground. After gathering signals from reflectometer 200 for both the forward and reverse path configurations using feedback receiver 206, network analysis may be performed on the gathered measurements using control circuitry 28. The network analysis operations performed by circuitry 28 may be used to extract reflection coefficient Γ. Reflection coefficient Γ (which is related to the impedance of terminations 208) may be stored in memory within circuitry 28. Knowing the value of Γ and retaining this value in device 10 serves to calibrate reflectometer 200. Device 10 can then be shipped to a user and used normally to transmit and receive wireless signals.

During normal operation, control circuitry 28 may use reflectometer 200 to make measurements on antenna 40 (e.g., measurements of the reflection coefficient Γaut for antenna 40, which are related to antenna impedance). The value of Γaut may be gathered using either forward path measurements or reverse path measurements. By measuring antenna impedance in real time, control circuitry 28 can determine whether antenna 40 is being detuned or is otherwise being affected by the presence of nearby objects. If antenna 40 is being detuned, control circuitry 28 can take corrective action. For example, components 102 or other adjustable circuitry may be used to adjust antenna 40 so that antenna 40 performs as desired. The corrective actions to take in response to different measured antenna impedance values (i.e., different measured reflection coefficients) can be characterized for device 10 (e.g., one or more sample devices, etc.) during characterization operations made in advance. Antenna characterization results may be stored in memory in storage 28 and used in determining how to adjust antenna 40 in response to different measured values of Γaut. For example, antenna characterization tests may reveal that whenever the impedance of antenna 40 lies within a given range, an adjustable inductor in components 102 should have a particular corresponding inductance value. A component adjustment function based on a look-up table or other data structure may be used to determine how control circuitry 28 should adjust components 102 during operation as a function of measured antenna impedance (reflection coefficient Γaut) to ensure that antenna 40 operates satisfactorily.

During calibration, network analysis operations may be performed to determine Γ (and therefore the impedance) of terminations 208. Calibration operations involve using directional coupler measurements from reflectometer 200 and the known value of the impedance (and reflection coefficient) for calibration (reference) resistor 212 to determine Γ of terminations 208. The network analysis operations performed during calibration involve processing the measurements taken by feedback receiver 206 when reflectometer 200 is in both the forward path and reverse path configurations and assume that the value of Γ is the same for both of terminations 208. Terminations 208 are generally fabricated as part of a common integrated circuit (e.g., an integrated circuit on which directional coupler 202 is formed), so the assumption that terminations 208 have identical resistance will be valid.

During normal operation, either forward or reverse path measurements may be made to determine Γaut (and therefore the impedance of antenna 40). FIGS. 5, 6, 7, and 8 illustrate how Γaut may be determined based on network analysis of forward path measurements made during normal operation. If desired, network analysis computations of Γaut such as these may be based on reverse path measurements with reflectometer 200 and these types of computations can be used when determining Γ during calibration. The example of FIGS. 5, 6, 7, and 8 (pertaining to network analysis of forward path measurements) is merely illustrative.

Figure 5:
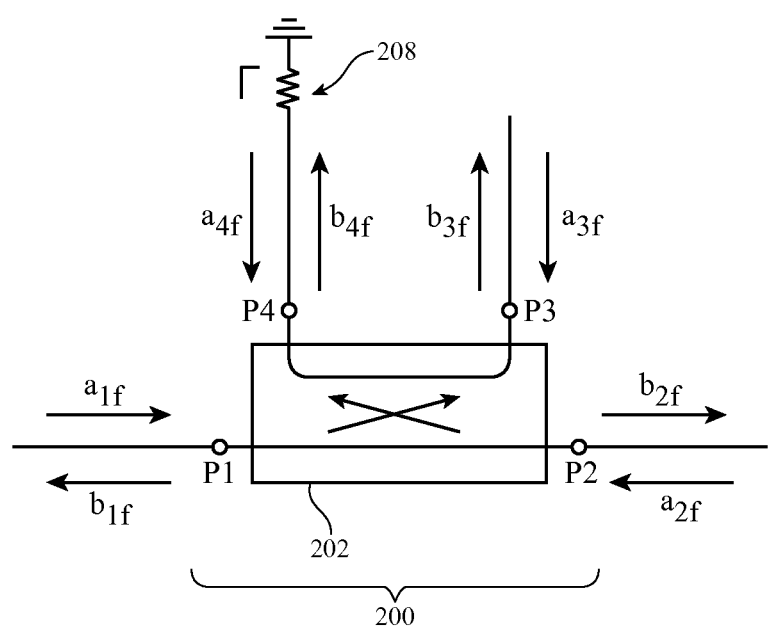
FIG. 5 is a diagram showing variable names for signals associated with paths in the reflectometer of FIG. 5 during forward path measurements in accordance with an embodiment of the present invention.

FIG. 5 is a diagram showing the signal notation that is used in equations 6, 7, and 8. Signal a$1f$ is the signal injected at port 1 from transceiver 90 and is known, signal b$3f$ is the signal being measured by feedback receiver 206 and is known. The other signals are not initially known. The value of Γ, which is the reflection coefficient of terminations 208, was obtained during calibration and is stored in circuitry 28. The variables S$ijk$ (i, j=1 to 4, k=f or b) are the S-parameters for directional coupler 202. In the equation of FIG. 6, the value of a$4f$ is calculated as a function of the known S-parameters, the known injected signal a$1f$, the known measured signal b$3f$, and the known value of Γ. In the equation of FIG. 7, the value of a$4f$ that was calculated using the equation of FIG. 6 is used (along with the known values of b$3f$ and a$1f$ and the known S-parameter values) to compute a$2f$. As shown in the equation of FIG. 8, the value of reflection coefficient Γaut for antenna 40 may then be calculated based on the value of a$2f$ from the equation of FIG. 7 and the known values of a$1f$ and a$4f$ from the equation of FIG. 6. The value of Γaut (or the related antenna impedance of antenna 40 that is a function of Γaut) may be used in making antenna adjustment decisions or other decisions involving the operation of device 10.

Figure 9:
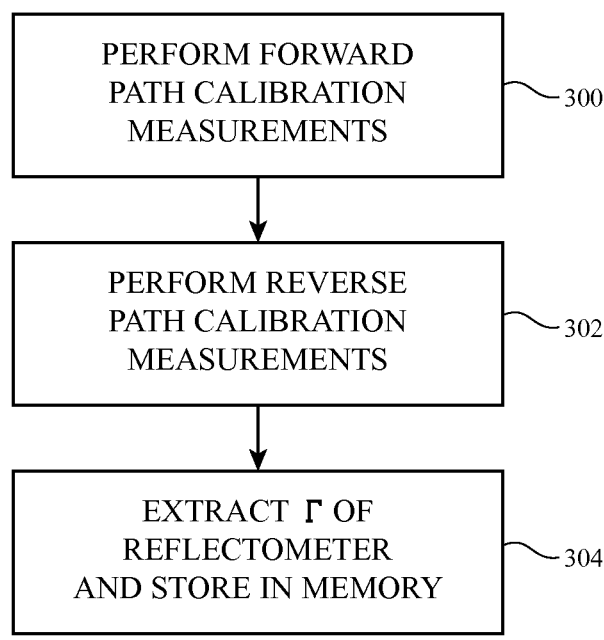
FIG. 9 is a flow chart of illustrative operations involved in calibrating a reflectometer in an electronic device in accordance with an embodiment.

FIG. 9 is a flow chart of illustrative steps involved in performing calibration operations to calibrate reflectometer 200. The operations of FIG. 9 may be performed during manufacturing or at any other suitable time.

At step 300, control circuitry 28 may use reflectometer 200, calibration circuit 210, and feedback receiver 206 to make forward path measurements. Calibration circuit 210 may be configured to switch reference (calibration) resistor 212 into use by coupling resistor 212 to port P2 of directional coupler 202. This switches antenna 40 temporarily out of use and substitutes the known load of resistor 212. Switching circuitry 204 of reflectometer 200 may be used to route forward path signals from port P3 to receiver 206 through switch SW1 while switch SW2 grounds port P4 via the termination 208 that is coupled to switch SW2. Measurements from receiver 206 are then gathered by control circuitry 28.

At step 302, control circuitry 28 may use reflectometer 200, calibration circuit 210, and feedback receiver 206 to make reverse path measurements. During these measurements, calibration circuit 210 is still configured to switch reference resistors 212 into use, but the states of switches SW1 and SW2 are reversed, so that port P3 is grounded via the right-hand termination 208 in FIG. 4 while signals from port P4 are measured by receiver 206. Circuitry 28 gathers measurements from receiver 206.

During the operations of step 304, control circuitry 28 may extract the value of Γ (i.e., the reflection coefficient for each of terminations 208) from the measurements gathered at steps 300 and 302 using network analysis. The value of Γ serves as calibration information for reflectometer 200 and may be stored in memory in circuitry 28 for future use in calibrating antenna impedance measurements (reflection coefficient measurements) that are made using reflectometer 200.

Figure 10:
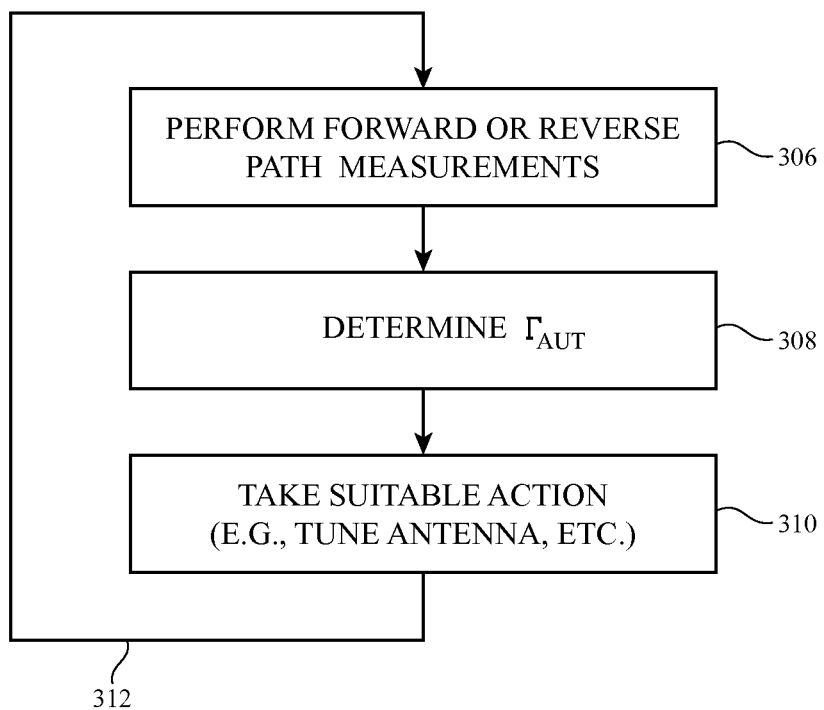
FIG. 10 is a flow chart of illustrative operations involved in using an electronic device with an antenna and a calibrated reflectometer that monitors the antenna in accordance with an embodiment.

Illustrative steps involved in operating device 10 during normal operation (i.e., after reflectometer 200 in device 10 has been calibrated by gathering Γ) are shown in FIG. 10.

At step 306, control circuitry 28 may perform either forward or reverse path measurements on antenna 40 using reflectometer 200 and feedback receiver 206. During these measurements, calibration circuit 210 is configured to switch reference resistor 212 out of use and is configured to couple port P2 to antenna 40 so that antenna 40 may be used normally by transceiver circuitry 90. As described in connection with FIGS. 5, 6, 7, and 8, the measurements of step 306 allow control circuitry 28 to compute the reflection coefficient Γaut of antenna 40 (i.e., the impedance of antenna 40) at step 308. Once Γaut is known, control circuitry 28 can take suitable action in controlling the operation of device 10 at step 310. For example, control circuitry 28 can compare the value of Γaut (reflection coefficient or antenna impedance) to a table or other data structure that includes corresponding antenna settings for antenna 40 that are to be used to ensure that antenna 40 performs satisfactorily. The table or other data structure may, for example, be a look-up table that provides control circuitry 28 with appropriate settings to use for components 102 as a function of measured reflection coefficient (antenna impedance). Upon obtaining the appropriate settings for components 102 or other adjustable antenna circuitry for antenna 40, control circuitry 28 can adjust antenna 40 by adjusting components 102 accordingly. Wireless signals may then be transmitted and received normally using transceiver 90 and antenna 40. The antenna monitoring and adjustment operations of steps 306 and 308, and 310 may be periodically repeated, as illustrated by line 312 (e.g., according to a schedule, when predetermined criteria have been satisfied, when a measurement command is received from external equipment, etc.).

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   radio-frequency transceiver circuitry;
   an antenna;
   a transmission line path that couples the antenna to the radio-frequency transceiver circuitry;
   a reflectometer coupled in the transmission line path between the antenna and the radio-frequency transceiver circuitry; and
   a calibration circuit coupled between the reflectometer and the antenna, wherein the reflectometer comprises:
   a feedback receiver;
   first and second terminations of identical impedance that are coupled to ground;
   a directional coupler with first and second ports;
   a first switch that couples the first port to the first termination in a first configuration and couples the first port to the feedback receiver in a second configuration; and
   a second switch that couples the second port to the second termination in a first configuration and couples the second port to and the feedback receiver in a second configuration.

2. The electronic device defined in claim 1 wherein the first and second terminations are characterized by a reflection coefficient and the electronic device comprises control circuitry that stores the reflection coefficient to calibrate the reflectometer.

3. The electronic device defined in claim 2 wherein the calibration circuit has a first state in which a calibration resistance is switched into use and is coupled to the reflectometer and a second state in which the calibration resistance is switched out of use and the antenna is coupled to the reflectometer and the reflection coefficient is determined by the control circuitry using forward path and reverse path measurements made using the directional coupler, the switching circuitry, and the feedback receiver.

4. The electronic device defined in claim 3 wherein the calibration circuit comprises a 50 ohm resistor that provides the calibration resistance.

5. The electronic device defined in claim 4 wherein the calibration circuit further comprises a switch controlled by the control circuitry that selectively couples the reflectometer to one of: the 50 ohm resistor and the antenna.

6. The electronic device defined in claim 4 further comprising peripheral conductive housing structures, wherein the antenna comprises an inverted-F antenna resonating element that is formed from the peripheral conductive housing structures.

7. The electronic device defined in claim 3 wherein the calibration circuit comprises a switch connector.

8. The electronic device defined in claim 2 wherein the antenna comprises a hybrid inverted-F slot antenna.

9. The electronic device defined in claim 2 wherein the control circuitry is configured to calibrate the reflectometer and store the reflection coefficient by gathering both forward path measurements and reverse path measurements with the reflectometer.

10. A method of operating an electronic device having radio-frequency transceiver circuitry coupled to an antenna with a transmission line path, wherein the antenna includes adjustable circuitry, the method comprising:
   with control circuitry in the electronic device, controlling a reflectometer interposed in the transmission line path to gather a calibrated reflection coefficient measurement for the antenna; and
   adjusting the adjustable circuitry of the antenna based on the calibrated reflection coefficient measurement for the antenna.

11. The method defined in claim 10 wherein the reflectometer comprises a feedback receiver, first and second terminations of identical impedance that are coupled to ground, a directional coupler, and switching circuitry that is used in routing signals from the directional coupler to the feedback receiver and to ground and controlling the reflectometer comprises controlling the switching circuitry while measuring signals with the feedback receiver.

12. The method defined in claim 11 wherein a calibration circuit is coupled between the reflectometer and the antenna, the method further comprising:
   transmitting and receiving signals with the radio-frequency transceiver circuitry and the antenna while the calibration circuit couples the directional coupler to the antenna.

13. The method defined in claim 12 further comprising:
   performing calibration operations for the reflectometer by transmitting and receiving signals with the radio-frequency transceiver circuitry while the calibration circuit couples the directional coupler to a calibration resistor.

14. The method defined in claim 13 wherein the antenna has an inverted-F antenna resonating element separated from an antenna ground by a gap and the adjustable circuitry bridges the gap.

15. An electronic device, comprising:
   a housing;
   control circuitry in the housing;
   radio-frequency transceiver circuitry;
   an antenna;
   a transmission line path that couples the antenna to the radio-frequency transceiver circuitry;
   a reflectometer coupled in the transmission line path between the antenna and the radio-frequency transceiver circuitry, wherein the reflectometer is controlled by the control circuitry; and
   a calibration circuit coupled between the reflectometer and the antenna, wherein the calibration circuit comprises:
      a calibration resistor; and
      a switch having a first port coupled to the antenna, a second port coupled to the reflectometer, and a third port coupled to the calibration resistor.

16. The electronic device defined in claim 15 wherein the reflectometer comprises:
   first and second terminations of identical impedance that are coupled to ground;
   a directional coupler; and
   switching circuitry that coupled between the directional coupler and the first and second terminations, wherein the switching circuitry is controlled by the control circuitry.

17. The electronic device defined in claim 16 wherein the antenna includes adjustable circuitry that is adjusted by the control circuitry based on calibrated reflection coefficient measurements made on the antenna with the reflectometer.

18. The electronic device defined in claim 17 wherein the control circuitry stores a reflection coefficient for the terminations and the electronic device housing comprises peripheral conductive structures that form part of the antenna.

19. The electronic device defined in claim 1, wherein the feedback receiver is configured to make phase and magnitude measurements on signals received from the directional coupler.

20. The electronic device defined in claim 1, further comprising:
   a housing; and
   a display in the housing, wherein the radio-frequency transceiver circuitry, the antenna, the transmission line path, the reflectometer, and the calibration circuit are formed in the housing.

21. The electronic device defined in claim 1, wherein the first and second terminations comprise resistors.

22. The method defined in claim 10, wherein the adjustable circuitry comprises an adjustable inductor.

* * * * *